(12) United States Patent
Park et al.

(10) Patent No.: US 11,552,144 B2
(45) Date of Patent: Jan. 10, 2023

(54) LIGHT EMITTING DIODE DISPLAY DEVICE

(71) Applicant: SAMSUNG DISPLAY CO., LTD., Yongin-si (KR)

(72) Inventors: Sang Ho Park, Hwaseong-si (KR); Yeon Hong Kim, Hwaseong-si (KR); Jin Yeong Kim, Icheon-si (KR); Jin Taek Kim, Yongin-si (KR); Soo Hyun Moon, Incheon (KR); Mi Jin Park, Suwon-si (KR); Tae Hoon Yang, Yongin-si (KR); Sung-Jin Lee, Yongin-si (KR); Jin Woo Lee, Suwon-si (KR); Kwang Taek Hong, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/579,699

(22) Filed: Jan. 20, 2022

(65) Prior Publication Data

US 2022/0140029 A1  May 5, 2022

Related U.S. Application Data

(63) Continuation of application No. 16/937,035, filed on Jul. 23, 2020, now Pat. No. 11,233,104.

(30) Foreign Application Priority Data

Aug. 8, 2019 (KR) .......................... 10-2019-0096736

(51) Int. Cl.
*G09G 3/30* (2006.01)
*H01L 27/32* (2006.01)
(Continued)

(52) U.S. Cl.
CPC ....... *H01L 27/3248* (2013.01); *G09G 3/3233* (2013.01); *G09G 3/3258* (2013.01);
(Continued)

(58) Field of Classification Search
CPC .. G09G 3/30; G09G 3/32; G09G 3/34; G09G 3/3233; G09G 3/3258; H01L 27/32; G06F 3/32
See application file for complete search history.

(56) References Cited

U.S. PATENT DOCUMENTS 10,134,332 B2   11/2018  Kimura et al.
2008/0136795 A1*  6/2008  Numao ................ G09G 3/3233
                                                    345/204
(Continued)

FOREIGN PATENT DOCUMENTS

KR   10-2015-0101027    9/2015
KR   10-2017-0050726    5/2017
(Continued)

*Primary Examiner* — Pegeman Karimi
(74) *Attorney, Agent, or Firm* — F. Chau & Associates, LLC

(57) ABSTRACT

A light emitting diode display device including: an organic light emitting diode including an anode electrode; a first transistor for providing a current to the anode electrode of the organic light emitting diode; a second transistor for transmitting a voltage to a gate electrode of the first transistor; a first capacitor for storing the voltage transmitted to the gate electrode of the first transistor; and a second capacitor disposed between a first electrode of the second transistor and a data line, wherein the first electrode of the second transistor is directly connected to the anode electrode of the organic light emitting diode.

12 Claims, 13 Drawing Sheets

(51) Int. Cl.
*G09G 3/3233* (2016.01)
*G09G 3/3258* (2016.01)
*H01L 27/12* (2006.01)

(52) U.S. Cl.
CPC . *H01L 27/3262* (2013.01); *G09G 2300/0426* (2013.01); *G09G 2300/0809* (2013.01); *H01L 27/1225* (2013.01); *H01L 27/3265* (2013.01)

(56) References Cited

U.S. PATENT DOCUMENTS

| | | | |
|---|---|---|---|
| 2012/0235973 A1 | 9/2012 | Yoo | |
| 2013/0099692 A1* | 4/2013 | Chaji | G09G 3/3233 |
| | | | 315/224 |
| 2016/0125801 A1 | 5/2016 | Chung et al. | |
| 2017/0337872 A1* | 11/2017 | Chai | G09G 3/3233 |
| 2018/0158844 A1* | 6/2018 | Choi | H01L 27/124 |
| 2019/0051669 A1* | 2/2019 | Lee | G09G 3/3275 |
| 2021/0043707 A1 | 2/2021 | Park et al. | |

FOREIGN PATENT DOCUMENTS

| | | |
|---|---|---|
| KR | 10-2018-0012442 | 2/2018 |
| KR | 10-2018-0046708 | 5/2018 |
| KR | 10-2019-0025424 | 3/2019 |

* cited by examiner

FIG. 4

| | |
|---|---|
| SPC | 300 |
| PDL | 300 |
| PXL | 191 |
| VIA | 180 |
| DAT2 | 171 173 175 177 |
| ILD4 | 164 |
| DAT1 | 179 |
| ILD3(CMP) | 163 |
| GAT3 | 125 176 178 |
| GI2 | 142 |
| Oxide | 135 |
| ILD2 | 162 |
| GAT2 | 122 126 |
| ILD1 | 161 |
| GAT1 | 121 |
| GI | 141 |
| ACT | 130 |
| Buffer | 111 |
| Barrier/PI | 110 |

LIGHT EMITTING DIODE DISPLAY DEVICE

CROSS-REFERENCE TO RELATED APPLICATIONS

This application is a continuation of U.S. patent application Ser. No. 16/937,033 filed on Jul. 23, 2020, which claims priority under 35 U.S.C. § 119 to Korean Patent Application No. 10-2019-0096736 filed in the Korean intellectual Property Office on Aug. 8, 2019, the disclosures of which are incorporated by reference herein in their entireties.

(a) Technical Field

The present invention relates to a light emitting diode display device, and more particularly, to a light emitting diode display device including transistors using different semiconductors.

(b) Description of the Related Art

Recently, an organic light emitting e display device has been used as a device fair displaying an image.

Since the organic light emitting diode display device does not require an additional light source as it has a self emission characteristic, it is possible to reduce thickness and weight thereof. Further, the organic light emitting diode display device has high-quality characteristics such as low power consumption, high luminance, and high response speed.

Generally, the organic light emitting diode display device includes a substrate, a plurality of thin film transistors disposed on the substrate, a plurality of insulating films disposed between wires for configuring the thin film transistors, and an organic light emitting diode (OLED) connected to the thin film transistors. The OLED may include an emissive electroluminescent layer that emits light in response to an electric current provided from the plurality of thin film transistors. However, since the plurality of thin film transistors are used to operate one OLED to emit light, there is a limit to reducing an area occupied by a pixel.

SUMMARY

An exemplary embodiment of the present invention provides a light emitting diode display device including: an organic light emitting diode including an anode electrode; a first transistor for providing a current to the anode electrode of the organic light emitting diode; a second transistor for transmitting a voltage to a gate electrode of the first transistor; a first capacitor for storing the voltage transmitted to the gate electrode of the first transistor; and a second capacitor disposed between a first electrode of the second transistor and a data line, wherein the first electrode of the second transistor is directly connected to the anode electrode of the organic light emitting diode.

The second capacitor may include a first electrode connected to the first electrode of the second transistor and a second electrode connected to the data line, and the first electrode of the second capacitor may be connected to the anode electrode of the organic light emitting diode.

The first capacitor may include a first electrode connected to the gate electrode of the first transistor and a second electrode for receiving a predetermined voltage.

The predetermined voltage received at the second electrode of the storage capacitor may be an in voltage.

The first transistor may further include a first electrode for receiving a driving voltage and a second electrode connected to the anode electrode of the organic light emitting diode.

The second electrode of the first transistor may be connected to the anode electrode, the first electrode of the second capacitor, and the first electrode of the second transistor.

The organic light emitting diode may further include a cathode electrode for receiving a driving low voltage, and the driving voltage and the driving low voltage may have a high voltage and a low voltage in a light emitting period, respectively.

An exemplary embodiment of the present invention provides a light emitting diode display device including: a substrate; a polycrystalline semiconductor layer disposed on the substrate; a first gate insulating film, covering the polycrystalline semiconductor layer; a first gate electrode that is disposed on the first gate insulating film and overlaps a portion of the polycrystalline semiconductor layer; a first interlayer insulating film covering the first gate electrode; an oxide semiconductor layer disposed on the first interlayer insulating film; a second gate insulating film covering at least a portion of the oxide semiconductor layer; a second gate electrode disposed on the second gate insulating film; a third interlayer insulating film covering the second gate electrode; an electrode of a first capacitor disposed on the third interlayer insulating film; a fourth interlayer insulating film covering the electrode of the first capacitor; first and second electrodes for a first transistor that are disposed on the fourth interlayer insulating film and electrically connected to first and second regions of the polycrystalline semiconductor layer, respectively; first and second electrodes for a second transistor that are disposed on the fourth interlayer insulating film and electrically connected to first and second regions of the oxide semiconductor layer, respectively; a passivation film that covers the first and second electrodes for the first transistor and the first and second electrodes for the second transistor and includes a first opening exposing the second electrode for the first transistor; an anode electrode connected to the second electrode for the first transistor through the first opening; and a partition wall including a second opening exposing a portion of the anode electrode, wherein the first opening and the second opening overlap each other.

The first opening may be disposed in the second opening.

The electrode for the first capacitor and the second electrode for the first transistor may overlap each other to form the first capacitor.

The light emitting diode display device may further include: an electrode for a second capacitor overlapping the first gate electrode, wherein the first gate electrode and the electrode for the second capacitor form the second capacitor.

The second electrode for the second transistor may be electrically connected to the second electrode of the first transistor, and the first electrode for the second transistor may be electrically connected to the second electrode of the second capacitor.

The first capacitor and the second capacitor may overlap.

The light emitting diode display device may further include: a second interlayer insulating film covering the electrode for the second capacitor, wherein the electrode for the second capacitor may be disposed on the first interlayer insulating film.

The light emitting diode display device may further include: an overlapping layer for the second transistor overlapping the oxide semiconductor layer, wherein the overlapping layer for the second transistor may be disposed on the first interlayer insulating film and covered by the second interlayer insulating film.

An electrode for the second capacitor may be disposed on they third interlayer insulating film.

The light emitting diode display device may further include: an overlapping layer disposed between the substrate and the polycrystalline semiconductor layer.

The light emitting diode display device may further include: an organic light emitting layer disposed in the second opening of the partition wall, a cathode electrode covering the organic light emitting layer and the partition wall, and an encapsulation layer covering the cathode electrode.

The second transistor may overlap the polycrystalline semiconductor layer of the first transistor.

An upper surface of the third interlayer insulating film may be flat.

An exemplary embodiment of the present invention provides a light emitting display device including: a light emitting element including an input terminal; a first transistor for providing a current to the input terminal of the light emitting element; a first capacitor for storing a voltage; a second transistor for connecting the first capacitor to the first transistor so that the voltage stored in the first capacitor is provided to the first transistor; and a second capacitor disposed between a first electrode of the second transistor and a data line, and directly connected to the first electrode of the second transistor and the input terminal of the light emitting element.

A first electrode of the first transistor may be connected to a driving voltage line and the second capacitor may be directly connected to a second terminal of the first transistor.

The first transistor may include a polycrystalline semiconductor layer and the second transistor may include an oxide semiconductor layer.

BRIEF DESCRIPTION OF THE DRAWINGS

FIG. 4 shows a table sequentially illustrating each layer of the organic light emitting diode display according to the exemplary embodiment of FIG. 3.

DETAILED DESCRIPTION OF THE EMBODIMENTS

Figure 1:
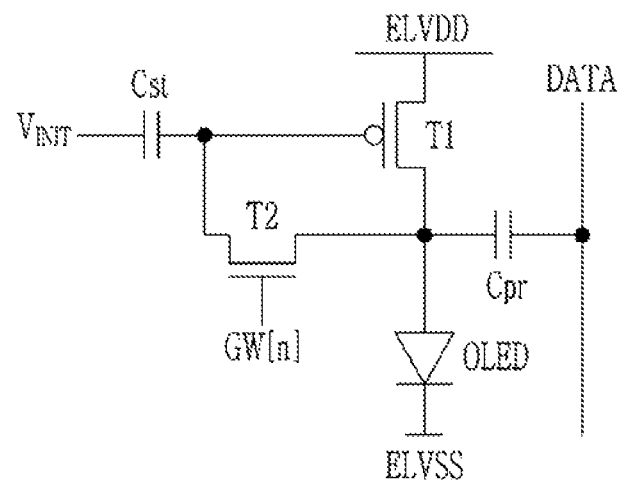
FIG. 1 illustrates an equivalent circuit diagram of a pixel of an organic light emitting diode display device according to an exemplary embodiment of the present invention.

Hereinafter, exemplary embodiments of the present invention will be described more fully with reference to the accompanying drawings. As those skilled in the art would realize, the described embodiments may be modified in various different ways, and thus, should not be limited to the embodiments set forth herein.

Like reference numerals may designate like elements throughout the specification.

In the drawings, the thicknesses of layers, films, panels, regions, etc., may be exaggerated for clarity.

It will be understood that when an element such as a layer, film, region, or substrate is referred to as being "on" another element, it can be directly on the other element or intervening elements may also be present.

Further, throughout the specification, the phrase "in a plan view" mays mean viewing a target portion from the top, and the phrase "in a cross-section" may mean viewing a cross-section formed by vertically cutting a target portion from the side.

A circuit structure of a pixel according to an exemplary embodiment of the present invention will now be described with reference to FIG. 1.

FIG. 1 illustrates an equivalent circuit diagram of a pixel of an organic light emitting diode display device according to an exemplary embodiment of the present invention.

A pixel of the organic light emitting diode display device according to the present embodiment includes first and second transistors T1 and T2, a storage capacitor Cst, an input capacitor Cpr, and an organic light emitting diode OLED.

The first transistor T1 (hereinafter also referred to as a driving transistor) receives a driving voltage ELVDD (hereinafter also referred to as a first driving voltage) and transmits an output current to the organic light emitting diode OLED according to a voltage at a gate electrode thereof. The gate electrode of the driving transistor T1 is connected to a first electrode of the storage capacitor Cst, and an output current of the driving transistor is determined according to a voltage stored in the first electrode of the storage capacitor Cst. The driving voltage ELVDD is applied to a first electrode of the driving transistor T1, and an anode of the organic light emitting diode OLED is connected to a second electrode of the driving transistor T1. The second electrode of the driving transistor T1 may also be connected to a first electrode of the input capacitor Cpr and a first electrode of the second transistor T2. The first electrode of the second transistor T2 may (hereinafter also be referred to as an input side electrode. The driving transistor T1 may be a p-type transistor, and outputs an output current when a low voltage is applied to its gate electrode.

The second transistor T2 (hereinafter also referred to as a switching transistor) connects the first electrode of the storage capacitor Cst and the first electrode of the input capacitor Cpr, and transmits a voltage of the first electrode of the input capacitor Cpr to the first electrode of the storage capacitor Cst. A gate electrode of the second transistor T2 is connected to a gate line to which a scan signal GW[n] is applied, the first electrode (e.g., the input side electrode) of the second transistor T2 is connected to the first electrode of the input capacitor Cpr, and a second electrode of the second transistor T2 is connected to the first electrode of the storage capacitor Cst. The second electrode of the second transistor T2 may hereinafter also be referred to as an output side electrode. The first electrode of the second transistor T2 may be connected to the second electrode of the driving transistor T1 and the anode of the organic light emitting diode OLED in addition to the first electrode of the input capacitor Cpr. Further, the second electrode of the second transistor T2 is connected to the gate electrode of the driving transistor T1 in addition to the first electrode of the storage capacitor Cst. Here, the second transistor T2 may be an n-type transistor, and is turned on when a high voltage is applied to the gate electrode thereof. In some exemplary embodiments of the present invention, the second transistor T2 may be a p-type transistor, which will be described with reference to FIG. 12 and FIG. 13.

The storage capacitor Cst is composed of two storage capacitor electrodes (e.g., the first electrode and the second electrode) and an insulating film disposed therebetween. The storage capacitor Cst stores and maintains the voltage transmitted to the gate electrode of the driving transistor T1 through the second transistor T2. The first electrode of the storage capacitor Cst is connected to the gate electrode of the driving transistor T1 and the second electrode (e.g., an output side electrode) of the second transistor T2. An initialization voltage $V_{INIT}$ is applied to the second electrode of the storage capacitor Cst.

A data line and a pixel to which a data voltage (DATA) is applied are connected by the M put capacitor Cpr. The input capacitor Cpr is composed of two input capacitor electrodes (e.g., the first electrode and the second electrode thereof) and an insulating film interposed therebetween. The first electrode of the input capacitor Cpr is connected to the first electrode (e.g., an input electrode) of the second transistor T2, while the second electrode of the input capacitor Cpr is connected to the data line. The first electrode of the input capacitor Cpr may also be connected to the second electrode of the driving transistor T1 and the anode of the organic light emitting diode OLED. When the data voltage applied to the second electrode of the input capacitor Cpr is changed, the voltage value of the first electrode located at an opposite side thereof is also changed, and the changed voltage value of the first electrode is applied to the gate electrode of the driving transistor T1 and the first electrode of the storage capacitor Cst through the second transistor T2. In other words, the pixel and the data line are not directly connected, but are connected by the input capacitor Cpr. In such a structure, there may be a slight difference between the data voltage applied to the data fine and the voltage actually transmitted to the pixel (e.g., the first electrode (input electrode) of the second transistor T2). Due to this structure, the voltage stored in the first electrode of the storage capacitor Cst does not leak through the data line even when a leakage occurs at the second transistor T2.

The organic light emitting diode OLED includes an anode electrode, a cathode electrode, and an organic light emitting layer interposed therebetween. The anode electrode is connected to the second electrode of the driving transistor T1, and the cathode electrode receives a driving low voltage ELVSS (hereinafter also referred to as a second driving voltage). The anode electrode of the organic light emitting diode OLED may also be connected to the first electrode of the input capacitor Cpr and the first electrode of the second transistor T2.

A signal applied to the pixel of the structure of FIG. 1 described above will now be described with reference to FIG. 2.

Figure 2:
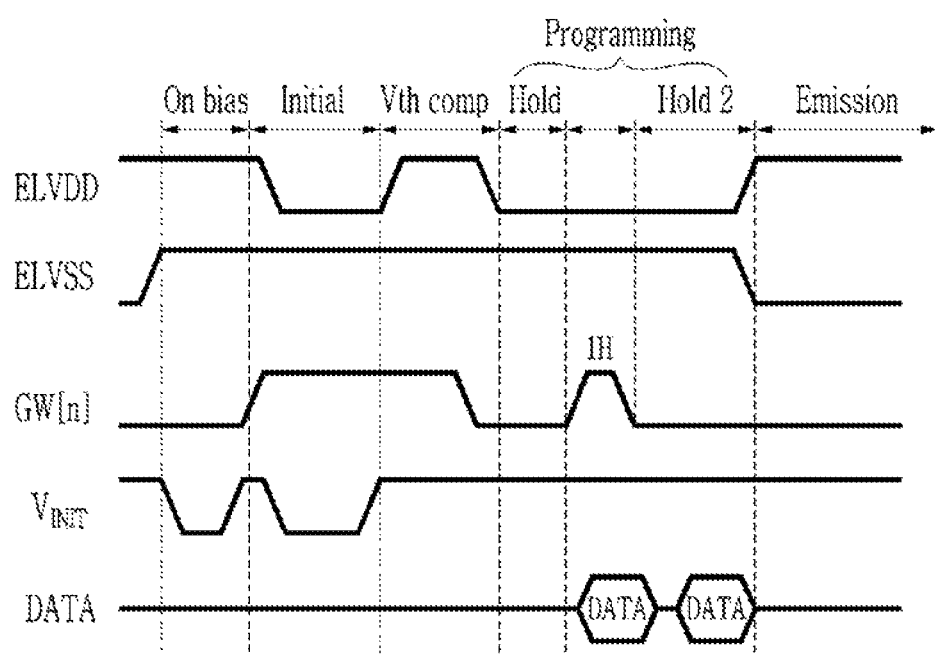
FIG. 2 illustrates a waveform diagram of a signal applied to the pixel of FIG. 1.

FIG. 2 illustrates a waveform diagram of a signal applied to the pixel of FIG. 1.

As shown in FIG. 2, the signal applied to the pixel may be divided into an initialization period (Initial), a compensation period (Vth comp), a programming period (Programming), and an emission period (Emission). In FIG. 2, an on-bias period (On-bias) and hold periods (Hold and Hold 2) included in the programming period are further included.

First, the on-bias period will be described. The on-bias period is a period for terminating the emission period, and in this period, a signal to prevent the organic light emitting diode OLED from emitting light is applied in other words, according to FIG. 2, the driving low voltage ELVSS is changed to a high voltage level and the initialization voltage $V_{INIT}$ is changed to the low voltage, and then, the initialization voltage $V_{INIT}$ is changed to the high voltage level. The other voltages (e.g., the driving voltage ELVDD, the scan signal GW[n], and the data voltage (DATA)) do not vary in the light emission period. In other words, the driving voltage ELVDD is maintained at the high voltage, the scan signal GW[n] is maintained at a gate-off voltage (e.g., the low voltage), and the data voltage (DATA) is maintained at a constant voltage corresponding to a ground voltage or a reference voltage.

In the on-bias period, the driving low voltage ELVSS is changed to have a high voltage level, thereby reversing a voltage relationship between the driving voltage FIN op and the driving low voltage ELVSS. For example, the driving voltage ELVDD is set higher than the driving low voltage ELVSS so that a current flows into the organic light emitting diode OLED; however, when the voltage relationship is reversed, the current does not flow through the organic light emitting diode OLED, such that the light emission period may be terminated. In other words, when the anode electrode has a high voltage and the cathode electrode has a low voltage, a current is applied from the anode electrode to the cathode electrode, and thus the organic light emitting diode OLED emits light according to an amount of the current. However, the organic light emitting diode OLED may not emit light when the voltage is changed to an opposite direction, in other words, when the cathode electrode has a high voltage. Therefore, in the on-bias period, a high voltage is applied as the driving low voltage ELVSS, so that the light emission period of the organic light emitting diode OLED is terminated.

Then, the initialization period proceeds. In the initialization period, the driving voltage ELVDD is changed to a low voltage level, and the scan signal GW[n] is changed to a high voltage which is a gate-on voltage. In addition, the initialization voltage $V_{INIT}$ may be changed to a low voltage like in the on-bias period, and then, may be changed back to a high voltage level. In this case, the driving low voltage ELVSS is maintained at a high voltage level, and the data voltage data is maintained at a constant voltage (e.g., a ground voltage or a reference voltage).

In the initialization period, a gate-on voltage is applied to the scan signal GW[n] such that the second transistor T2 is turned on to electrically connect the gate electrode of the driving transistor T1 to the second electrode of the driving transistor T1. In this case, the turned-on second transistor T2 may serve as a resistor so that voltages at the gate electrode and the second electrode of the driving transistor T1 may be different from each other. In other words, voltages of the first electrode of the storage capacitor Cst and the first electrode of the input capacitor Cpr may be different from each other. In this case, since the driving voltage ELVDD and the initialization voltage $V_{INIT}$ are changed to a low voltage, the voltage of the gate electrode of the driving transistor T1 (e.g., the voltage at the first electrode of the storage capacitor Cst) is also changed to a low voltage. Therefore, the voltage at the first electrode of the driving transistor may have a lower voltage than the voltage of the second electrode of the driving transistor T1 (e.g., the voltage at the first electrode of the input capacitor Cpr). After that, the initialization voltage $V_{INIT}$ is again changed to the high voltage and the initialization period ends.

Subsequently, the compensation period proceeds, and in this case, the driving voltage ELVDD is changed to a high voltage and other voltages are maintained. In other words, the gate-on voltage (high voltage) is maintained at the scan signal GW[n], the initialization voltage $V_{INIT}$ is maintained at a high voltage, the driving low voltage ELVSS is maintained at a high voltage level, and the data voltage data is maintained at a constant voltage (e.g., a ground voltage or a reference voltage).

In the compensation period, the driving transistor T1 outputs a current to the second electrode thereof depending on a difference between the voltage of the gate electrode (e.g., the voltage at the first electrode of the storage capacitor Cst) of the driving transistor T1 and the high voltage of the driving voltage ELVDD set in the initialization period. However, since the driving low voltage ELVSS has the high voltage, the current does not flow to the organic light emitting diode OLED, and the driving low voltage ELVSS is applied to the gate electrode of the driving transistor T1 (and the first electrode of the storage capacitor Cst) through the turned-on second transistor T2. In this case, when a voltage difference between the gate electrode and the second electrode of the driving transistor T1 is a threshold voltage Vth of the driving transistor T1, the driving transistor T1 does not output a current. This is because no channel is formed at the second electrode side in the semiconductor layer of the driving transistor T1 such that a path through which a current can flow is not formed. In other words, in the compensation period, the driving transistor T1 may initially output a current, but after a predetermined time, since a voltage difference between the gate electrode and the second electrode of the driving transistor T1 corresponds to the threshold voltage Vth of the driving transistor the current is not outputted. Accordingly, a voltage that is lower by the threshold voltage Vth than that of the second electrode of the driving transistor T1 (or the first electrode of the input capacitor Cpr) may be stored in the first electrode of the storage capacitor Cst.

After the driving transistor T1 does not output the current, the driving voltage ELVDD is changed back to a low voltage, and the scan signal GW[n] is changed to a gate-off voltage (e.g., a low voltage).

Then, the programming period proceeds. The programming period is a period in which the data voltage (DATA) is stored in the first electrode of the storage capacitor Cst and the scan signal GW[n] is sequentially applied to the gate line. In addition, a data voltage (DATA) to be written to a corresponding pixel is applied to the data line according to a timing at which the scan signal GW[n] is applied. For example, in the programming period, the scan signal GW[n] is sequentially applied to each gate line after a predetermined period (e.g., a first hold period) after the driving voltage ELVDD is changed to a low voltage. In this case, the initialization voltage $V_{INIT}$ is maintained at a high voltage, and the driving low voltage ELVSS is also maintained at a high voltage. Therefore, in the first hold period, the driving voltage ELVDD is maintained at a low voltage, the driving low voltage ELVSS is maintained at a high voltage, and the initialization voltage $V_{INIT}$ is maintained at a high voltage.

in this situation, the sequential scan signals GW[n] are applied to the gate lines, and thus, while the gate-on voltage, which is a high voltage, is sequentially applied to the gate lines, the gate-on voltages may not overlap each other in two or more gate lines.

When the gate-on voltage is applied to a specific gate line, e.g., a first gate line, a data voltage to be applied to a pixel connected to the first gate line is applied to the data line. When a data voltage (DATA) is changed at the data line, the voltage of the first electrode of the input capacitor Cpr is also changed, and in this case, the voltage when the second transistor T2 is turned on is transmitted to the first electrode of the storage capacitor Cst and stored (e.g., written). In other words, in the structure of FIG. 1, since the second transistor T2 is turned on, the voltage of the first electrode of the input capacitor Cpr that is changed according to the data voltage passes through the second transistor T2, and then, it is transmitted to and stored in the first electrode of the storage capacitor Cst. A period during which the gate-on voltage (e.g., a high voltage) is applied in the scan signal GW[n] is referred to as 1H, and the gate-off voltage (e.g., low voltage) is applied before and after 1H. In some exemplary embodiments of the present invention, the gate-on voltage may be changed to a low voltage depending on whether the second transistor T2 is a p-type or n-type transistor. All of the second transistors T2 connected to the same gate line are simultaneously turned on, and after 1H, the gate-on voltage is applied to a next gate line.

After the data voltage is stored in the storage capacitor Cst, a second hold period (Hold 2) follows. In other words, the voltage stored in the storage capacitor Cst is maintained until the light emission period. Although the data voltage applied to the data line is changed during, the second hold period, since the second transistor T2 is already turned off, the voltage of the first electrode of the storage capacitor Cst is maintained unchanged.

Thereafter, the light emission period proceeds. In the light emission period, the driving voltage ELVDD and the driving low voltage ELVSS are changed to have a voltage relationship in which a current can flow to the organic light emitting diode OLED, in other words, the driving voltage ELVDD is changed to a high voltage, and the driving low voltage ELVSS is changed to a low voltage. In this case, the initialization voltage $V_{INIT}$ is maintained at a high voltage, the gate-off voltage (e.g., a low voltage) is maintained at the gate line, and the data voltage is maintained at a constant voltage (e.g., a ground voltage or a reference voltage).

An amount of the current output from the driving transistor T1 is determined by a voltage difference between the high voltage of the driving voltage ELVDD and the voltage of the first electrode of the storage capacitor Cst, in other words, a voltage difference between the first electrode and the gate electrode of the driving transistor T1, and the current is transmitted to the organic light emitting diode OLED. In this case, since the second transistor T2 is turned off, the Output current of the driving transistor T1 is transmitted only to the organic light emitting diode OLED, and luminance of light emitted by the organic light emitting diode OLED is determined according to the amount of the current.

In other words, the luminance emitted by the organic light emitting diode OLED is determined according to the amount of the current flowing through the organic light emitting diode OLED. Since the current flowing through the organic light emitting diode OLED is the output current of the driving transistor T1, the output current is changed according to the voltage of the gate electrode of the driving transistor T1. Therefore, the luminance of the organic light emitting diode OLED may be controlled by adjusting the voltage of the gate electrode of the driving transistor T1. Since the voltage of the gate electrode of the driving transistor T1 is transmitted from the data line through the input capacitor Cpr, the luminance of the organic light, emitting diode OLED may be controlled by adjusting the voltage (e.g., the data voltage (DATA)) of the data line.

The emission period may simultaneously proceed for all of the pixels after the programming period is completed for all of the pixels. Accordingly, all of the pixels may emit light at the same time. In some exemplary embodiments of the present invention, the pixels may be divided into two or more groups, and each group may have a light emission period.

A high voltage value and a low voltage value of the driving voltage ELVDD may be different from a high voltage value and a low voltage value of the driving low voltage ELVSS. However, in some exemplary embodiments of the present invention, one high voltage and one low voltage are set, and the driving voltage ELVDD and the driving low voltage ELVSS may be used with those voltages. In addition, high and low voltages of the initialization voltage that are the same as the high and low voltages of the driving voltage ELVDD or the driving low voltage ELVSS may also be used.

In some exemplary embodiments of the present invention, an operation of the light emission period may be performed according to a method of adjusting the initialization voltage $V_{INIT}$. In these embodiments, while the initialization voltage $V_{INIT}$ is changed during the emission period, the voltage of the first electrode of the storage capacitor Cst is changed to set the driving transistor T1 to flow a current. In other words, before the light emission period, although a voltage that allows no current to flow in the driving transistor T1 is applied to the gate electrode of the driving transistor T1, as the initialization voltage $V_{INIT}$ is changed, the voltage of the first electrode of the storage capacitor Cst can be changed to operate the driving transistor T1. In these embodiments, the initialization voltage $V_{INIT}$ may be changed to have a lower level than a voltage when the light emission period proceeds. This further decreases the voltage of the gate electrode of the driving transistor T1 because the driving transistor T1 is a p type transistor. In this case, the driving voltage ELVDD and the driving low voltage ELVSS may be respectively maintained at the high voltage and the low voltage.

In some exemplary embodiments of the present invention, at least one of the periods shown in FIG. 2 may be omitted.

According to the structure of FIG. 1 in which the data voltage is applied to the pixel through the input capacitor Cpr, a current leaked to the outside of the pixel does not occur even if a leakage current occurs in the second transistor T2. In other words, in the structure which the data line and the pixel are directly connected, when the leakage current occurs in the pixel, a current is leaked to the outside through the data line occurs. In this case, the pixel includes an additional compensation transistor to prevent this from happening. However, in the present embodiment, since the pixel has a structure in which the pixel is connected to the data line through the input capacitor Cpr, an additional transistor may not be needed and thus an area occupied by the pixel can be reduced. Accordingly, as shown in FIG. 1, one pixel may operate without the aforementioned current leakage even when only two transistors T1 and T2 are included.

Unlike the embodiment of FIG. 1, the second electrode of the driving transistor T1 may be connected only to the anode of the organic light emitting diode OLED, and may not be connected to the first electrode of the input capacitor Cpr and the first electrode of the second transistor T2. In this case, an element such as an additional transistor that may periodically initialize the anode electrode of the organic light emitting diode OLED may be further included.

The pixel circuit of FIG. 1 as described above will now be described with reference to FIG. 3, which illustrates a specific stacked structure. The pixel circuit of FIG. 1 may have various stacked structures, and FIG. 3 illustrates a cross-sectional view of one stacked structure thereof.

Figure 3:
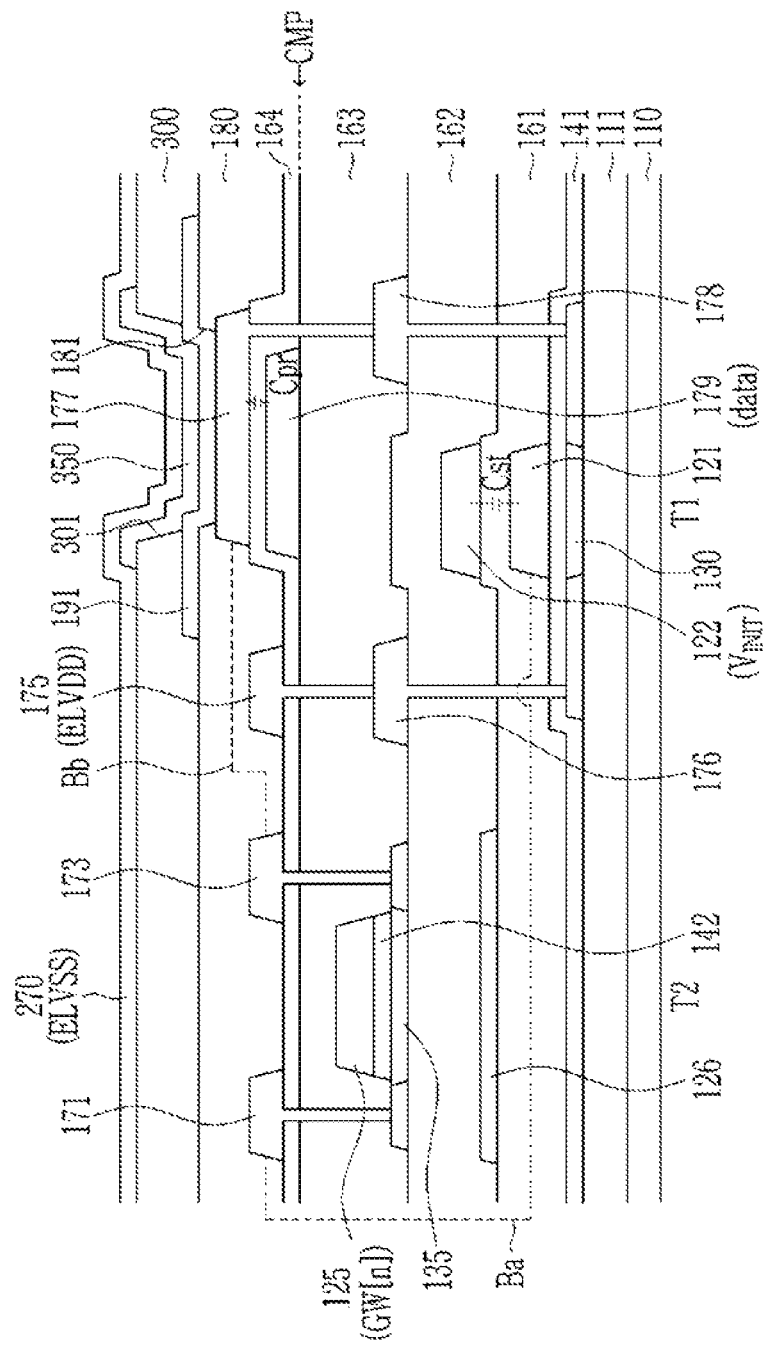
FIG. 3 illustrates a cross-sectional view of a pixel of an organic light emitting diode display device according to an exemplary embodiment of the present invention.

FIG. 3 illustrates a cross-sectional view of a pixel of an organic light emitting diode display device according to an exemplary embodiment of the present invention.

The organic light emitting diode display device according to the present embodiment may include a rigid substrate such as glass or a substrate formed of a flexible material such as plastic or polyimide (PI). FIG. 3 illustrates an example in which a substrate 110 formed of a flexible material.

A buffer layer 111 is disposed on the substrate 110. The buffer layer 111 may include an, inorganic insulating material such as a silicon oxide, a silicon nitride, an aluminum oxide, or the like. A barrier layer including an inorganic insulating material or an organic insulating material such as polyimide may be further formed between the flexible substrate 110 and the buffer layer 111. In addition, when the flexible substrate 110 is used, two or more substrates 110 may be formed, and in this case, two or more buffer layers 111 or barrier layers may be formed. However, FIG. 3 illustrates only one substrate 110 and one buffer layer 111 for the sake of simplicity.

A semiconductor layer 130 (hereinafter also referred to as a polycrystalline semiconductor layer) included in the driving transistor T1 is formed on the buffer layer 111. The semiconductor layer 130 included in the driving transistor T1 is formed of a polycrystalline semiconductor. The semiconductor layer 130 includes a channel region overlapping a gate electrode 121, which will be described later, and first and second regions positioned at opposite sides thereof.

A first gate insulating film 141 covering the polycrystalline semiconductor layer 130 is disposed on the polycrystalline semiconductor layer 130.

A gate electrode 121 (hereinafter also referred to as a first gate electrode) of the driving transistor T1 is formed on the first gate Insulating film 141. A channel of the driving transistor T1 is positioned at area where the gate electrode 121 of the driving transistor T1 overlaps the semiconductor layer 130. The semiconductor layer 130 may be doped except for the channel thereof.

The gate electrode 121 of the driving transistor T1 also serves as the first electrode of the storage capacitor Cst.

A first inter aver insulating film 161 is provided to cover the gate electrode 121 and the exposed first gate insulating film 141 of the driving transistor T1.

An overlapping layer 126 for the second transistor T2 and the second electrode 122 for the storage capacitor Cst are formed on the first interlayer insulating film 161. The second electrode 122 may hereinafter also be referred to as an electrode for a storage capacitor.

The second electrode 122 for the storage capacitor Cst and the gate electrode 121 of the driving transistor T1 overlap each other, and form the storage capacitor Cst together with the first interlayer insulating film 161 positioned therebetween. The initialization voltage $V_{INIT}$ is applied to the second electrode 122 for the storage capacitor Cst. In some exemplary embodiments of the present invention, the second electrode 122 for the storage capacitor Cst may be integrally formed with a line (e.g., an initialization line) for applying the initialization voltage $V_{INIT}$ thereto.

The overlapping layer 126 for the second transistor T2 is formed at an area where a semiconductor layer 135 for the second transistor T2 is to be formed. In addition, the overlapping layer 126 for the second transistor T2 overlaps a channel of the semiconductor layer 135 of the second transistor T2, and may overlap at least a portion of first and second regions positioned at opposite sides of the channel. In some exemplary embodiments of the present invention, the overlapping layer 126 for the second transistor T2 may receive a voltage of a constant level, may be electrically connected to one electrode of the second transistor T2, may receive the driving voltage ELVDD or the driving low voltage ELVSS, or may be floated. The overlapping layer 126 for the second transistor T2 serves to secure channel characteristics of the second transistor T2 to increase reliability of the second transistor T2.

A second interlayer insulating film 162 is positioned on the overlapping layer 126 for the second transistor T2, the second electrode 122 for the storage capacitor Cst, and the first interlayer insulating film 161 exposed by the overlapping layer 126 and the second electrode 122.

On the second interlayer insulating film 162, the semiconductor layer 135 for the second transistor T2, a second gate insulating film 142, a gate electrode 125 for the second transistor T2, and connecting portions 176 and 178 are formed. The semiconductor layer 135 may also be referred to as an oxide semiconductor layer and the gate electrode 125 may also be referred to as a second gate electrode. The gate electrode 125 for the second transistor T2 and the connecting portions 176 and 178 may be formed of the same material.

The semiconductor layer 135 for the second transistor T2 is formed at an area overlapping at least a portion of the overlapping layer 126 for the second transistor T2, and is formed of an ox ide semiconductor. The semiconductor layer 135 for the second transistor T2 includes a channel region overlapping the gate electrode 125 for the second transistor T2, which will be described later, and first and second regions positioned at opposite sides thereof. The first region and the second region of the semiconductor layer 133 for the second transistor T2 may be doped. The second transistor T2 including the oxide semiconductor may have characteristics of an n-type transistor or a p-type transistor by doping.

By using an oxide semiconductor in the semiconductor layer 135 for the second transistor T2, a leakage current characteristic of the second transistor T2 may be reduced. In other words, in a case of using a polycrystalline semiconductor such as the driving transistor T1, the voltage written in the storage capacitor Cst may not be easily maintained because the leakage current is relatively large. However, it is easy to maintain the voltage of the storage capacitor Cst by using the oxide semiconductor. Accordingly, there is no need to use a structure that uses an additional transistor to prevent a leakage current.

The second gate insulating film 142 and the gate electrode 125 for the second transistor T2 are sequentially formed on the channel of the semiconductor layer 135 for the second transistor T2. In the present embodiment, the second gate insulating film 142 is positioned only on the channel of the semiconductor layer 135 for the second transistor T2, in other words, only under the gate electrode 125 for the second transistor T2. In the embodiment of FIG. 3, when the gate electrode 125 for the second transistor T2 is etched, since the second gate insulating film 142 is also etched, it has the same planar shape as the gate electrode 125 for the second transistor T2. However, in some exemplary embodiments of the present invention, the second gate insulating film 142 may cover all of the semiconductor layers 135 for the second transistor T2, and all of the exposed second interlayer insulating film 162.

The gate electrode 125 for the second transistor T2 may be electrically connected to the gate line to which the scan signal GW[n] is applied, and may have an integrally formed structure in the present embodiment.

Additionally, the two connecting portions 176 and 178 are positioned at an upper portion of the second interlayer insulating film 162 and at which the driving transistor T1 is positioned. The first connecting portion 176 is connected to the first region of the semiconductor layer 130 through openings formed in the first gate insulating film 141, the first interlayer insulating film 161, and the second interlayer insulating film 162. The second connecting portion 178 is connected to the second region of the semiconductor layer 130 through openings formed in the first gate insulating film 141, the first interlayer insulating film 161, and the second interlayer insulating film 162. The two connecting portions 176 and 178 are additionally formed to assist a first electrode 175 and a second electrode 177 of the driving transistor T1 to be connected to the first region and the second region of the semiconductor layer 130, respectively, but in some exemplary embodiments of the present invention, they may be omitted. However, in some exemplary embodiments of the present invention, unlike FIG. 3, the first electrode 175 and the second electrode 177 of the driving transistor T1 may be respectively connected to the first region and the second region of the semiconductor layer 130 by including more connecting portions. The two connecting portions 176 and 178 may overlap at least a portion of an area occupied by an opening 301 formed in a partition wall 300 to be described later, or may be located in the opening 301. This can reduce an area occupied by the pixel.

A third interlayer insulating film 163 is formed on the semiconductor layer 135 for the second transistor T2, the second gate insulating film 142, the gate electrode 125 for the second transistor T2, the connecting portions 176 and 178, and the exposed second interlayer insulating film 162. The third interlayer insulating film 163 may be formed of an inorganic insulating material such as a silicon oxide or a silicon nitride, and may be thicker than the first interlayer insulating film 161 and the second interlayer insulating film 162. In some exemplary embodiments of the present invention, the third interlayer insulating film 163 may be formed as a double layer of a silicon nitride film and a silicon oxide film. Since the input capacitor Cpr and the organic light emitting diode OILED are to be formed on the third interlayer insulating film 163, a large step may occur due to structures of a lower electrode and the semiconductor layer below the third interlayer insulating film 163. The large step may cause the electrodes of the input capacitor Cpr and the organic light emitting diode OLED to be displaced. Accordingly, to remove the step, the third interlayer insulating film 163 may be formed thick and then planarized by chemical mechanical polishing (CMP). In FIG. 3, the third interlayer insulating film 163 having an upper surface that is planarized by a CMP process is illustrated, and the CMP is illustrated at a position thereof. Since the upper surface of the third interlayer insulating film 163 is planarized, as illustrated in FIG. 3, the input capacitor Cpr and the organic light emitting diode OLED may be formed without a step.

A second electrode 179 (hereinafter also referred to as an electrode for an input capacitor) for the input capacitor Cpr is formed on the third interlayer insulating film 163. The second electrode 179 for the input capacitor Cpr is electrically connected to the data line to receive the data voltage.

In some exemplary embodiments of the present invention, the second electrode 179 may be integrally formed with the data line.

A fourth interlayer insulating film 164 is positioned on the second electrode 179 for the input capacitor Cpr and the exposed third interlayer insulating film 163.

The first electrode 175 for the driving transistor T1, the second electrode 177 for the driving transistor T1, a second electrode 171 for the second transistor T2, and a first electrode 173 for the second transistor T2 are formed on the fourth interlayer insulating film 164.

The first electrode 175 of the driving transistor T1 is connected to the first connecting portion 176 through an opening formed in the third interlayer insulating film 163 and the fourth interlayer insulating film 164, and thus, is connected to the first region of the semiconductor layer 130. The driving voltage ELVDD may be applied to the first electrode 175 of the driving transistor T1, and the driving transistor T1 may be electrically connected to a wire e.g., a driving voltage line) that applies the driving voltage ELVDD or the driving transistor T1 may be integrally formed with the wire.

The second electrode 177 of the driving transistor T1 is connected to the second connecting portion 178 through the opening formed in the third interlayer insulating film 163 and the fourth interlayer insulating film 164, and thus, is connected to the second region of the semiconductor layer 130. In addition, the second electrode 177 of the driving transistor T1 overlaps the second electrode 179 for the input capacitor Cpr to form the input capacitor Cpr. Further, referring to FIG. 3, the input capacitor Cpr and the storage capacitor Cst formed by overlapping overlap each other in a vertical direction. Accordingly, an area occupied by the capacitors is reduced.

The second electrode 171 of the second transistor T2 is connected to the first region of the semiconductor layer 135 for the second transistor T2 through the opening formed in the third interlayer insulating film 163 and the fourth interlayer insulating film 164. In addition, FIG. 3 illustrates that the second electrode 171 of the second transistor T2 is electrically connected to the first electrode 121 for the storage capacitor Cst by a dotted line Ba.

The first electrode 173 of the second transistor T2 is connected to the second region of the semiconductor layer 135 for the second transistor T2 through the opening formed in the third interlayer insulating film 163 and the fourth interlayer insulating film 164, In addition, FIG. 3 illustrates that the first electrode 173 of the second transistor T2 is electrically connected to the second electrode 177 for the driving transistor T1 by a dotted line Bb.

A passivation film 180 is formed on the first electrode 175 and the second electrode 177 of the driving transistor T1, the second electrode 171 and the first electrode 173 of the second transistor T2, and the exposed fourth interlayer insulating film 164.

The passivation film 180 includes an opening 181 (hereinafter also referred to as a first opening) exposing the second electrode 177 of the driving transistor T1.

An anode electrode 191 is formed on the passivation film 180, and the anode electrode 191 is connected to the second electrode 177 of the driving transistor T1 through the opening 181. The anode electrode 191 may include a transparent conductive material or a metal material, and may have a multilayer structure including two or more of the transparent conductive material and the metal material. In some exemplary embodiments of the present invention, the organic light emitting diode OLED including the anode electrode 191 may be formed to have a different thickness according to light being emitted. In other words, thicknesses of the anode electrode 191 included in a red organic light emitting diode OLED, of the anode electrode 191 included in a green organic light emitting diode OLED, and of the anode electrode 191 included in a blue organic light emitting diode MED may be different from each other. In some exemplary embodiments of the present invention, the thickness of the anode electrode 191 included in the red organic light emitting diode OLED may be the thickest, followed by the thickness of the anode electrode 191 included in the blue organic light emitting diode OLED, and then by the thickness of the anode electrode 191 included in the green organic light emitting diode OLEO. A thickness difference between respective anode electrodes 191 may be changed by the presence or absence of a transparent conductive material, such as an ITO or IZO, on the metal layer, or by controlling a thickness of the transparent conductive material.

On the anode electrode 191 and the exposed passivation film 180, the partition wall 300 having the opening 301 (hereinafter also referred to as a second opening) that partitions a light emitting region of the organic light emitting diode OLEO is formed. The opening 301 exposes the anode electrode 191, and an organic light emitting layer 350 is formed in the opening 301. In some exemplary embodiments of the present invention, a spacer may be further formed on the partition wall 300 or at the same layer as the partition wall 300.

A cathode electrode 270 is formed on the partition wall 300 and the organic light emitting layer 350. The cathode electrode 270 receives the driving low voltage ELVSS.

In FIG. 3, the opening 301 positioned in the partition wall 300 and the opening 181 positioned in the passivation film 180 overlap each other in a vertical direction hereinafter this is also referred to as a vertical overlapping structure of the opening).

In addition, the opening 301 located in the partition wall 300 and the opening from the second region of the semiconductor layer 130 of the driving transistor T1 to the second electrode 177 overlap each other in a vertical direction. The opening from the second region of the semiconductor layer 130 of the driving transistor T1 to the second electrode 177 corresponds to the opening connecting the second region of the semiconductor layer 130 and the second connecting portion 178 and the opening connecting the second connecting portion 178 and the second electrode 177 in FIG. 3.

In addition, the second connecting portion 178 connecting the second region of the semiconductor layer 130 of the driving transistor T1 and the second electrode 177 is also disposed inside the anode electrode 191. In other words, the anode electrode 191 and the second connecting portion 178 overlap in the vertical direction.

The area occupied by the pixel is reduced due to the vertical overlapping structure between the openings 301 and 181 as described above.

In addition, in the embodiment of FIG. 3, the storage capacitor Cst and the input capacitor Cpr also overlap each other in the vertical direction (which is also referred to as vertical overlapping structure of capacitors, hereinafter). In other words, the storage capacitor Cst is formed by overlapping the second electrode 122 for the storage capacitor Cst and the gate electrode 121 of the driving transistor T1. The input capacitor Cpr is formed on the storage capacitor Cst by overlapping the second electrode 179 for the input capacitor Cpr and the second electrode 177 of the driving transistor T1. This way, the storage capacitor Cst and the input capacitor Cpr exist above and below each other and have the overlapping portion. The area occupied by the pixel is also reduced due to the vertical overlapping structure of the capacitors.

The above described vertical overlapping structures can reduce the area occupied by the pixels. The area reduction according to the vertical overlapping structure of the openings with be further described with reference to FIG. 5 and FIG. 6.

Additionally, an encapsulation layer that protects the organic light emitting diode OLED may be disposed on the cathode electrode 270. The encapsulation layer may contact the cathode electrode 270, or may be spaced apart from the cathode electrode 210 due to the additional formation of a capping layer and a functional layer. The encapsulation layer may be a thin film encapsulation layer in which an inorganic film and an organic film are stacked, and may include a triple layer formed of an inorganic film, an organic film, and an inorganic film.

In the pixel of the organic light emitting diode display device according to the embodiment shown in FIG. 1 and FIG. 3, since the data voltage is transmitted by the input capacitor Cpr, even if a leakage current occurs in the pixel, it does not leak to the outside through the data line. Accordingly, even though the leakage current is not blocked by forming transistors other than the two transistors, the pixel may properly operate. In addition, since the second transistor T2 uses the oxide semiconductor to reduce the leakage current rather than the second transistor T2 using the polycrystalline semiconductor, the extra compensation transistor may not be further formed.

As described above, an additional compensation transistor is not included and only two transistors are included in a pixel, and thus, it is possible to significantly reduce the area occupied by the pixel.

In addition, referring to FIG. 3, the area occupied b the pixel is reduced because the opening 181 of the passivation film 180 exposing the anode electrode 191 vertically overlaps the opening 301 of the partition wall 300 that is an area in which the organic light emitting diode OLED emits light. Further, in some exemplary embodiments of the present invention, since the opening and/or the second connecting portion 178 connecting the second electrode 177 of the driving transistor T1 and the second region of the semiconductor layer 130 is formed while overlapping the opening 301 of the partition wall 300, the area occupied by the pixel may be further reduced.

Accordingly, it is possible to manufacture an organic light emitting diode display device having a high number of pixels per inch (ppi). In addition, it is possible to form an organic light emitting diode display device of a high resolution.

Hereinafter, a manufacturing order of respective constituent elements used in FIG. 3 will be described with reference to FIG. 4.

FIG. 4 is a table sequentially illustrating respective layers of the organic light emitting diode display device according to an exemplary embodiment of the present invention.

In FIG. 4, the left terms represent the names of respective layers in English abbreviations, and the right terms represent the reference numerals of the constituent elements corresponding to the respective layers in FIG. 3.

First, Barrier/PI refers to the flexible substrate 110, and indicates that a layer formed of a flexible material such as a barrier layer and PI is located on the substrate 110 in this case, the barrier layer may be formed of various inorganic insulating materials, and may include a silicon oxide or a silicon nitride, and in some exemplary embodiments of the present invention, it may include an amorphous semiconductor, or may be formed as a plurality of layers with an inorganic insulating material. Herein, the polyimide (PI) may be formed to have a thickness of 5 μm to 20 μm, and the inorganic insulating material layer or the amorphous semiconductor layer formed together therewith may have a thickness of 500 Å to 7000 Å.

Buffer, which is over Barrier/PI, refers to the buffer layer 111, and it may be formed of an inorganic insulating material such as a silicon oxide or a silicon nitride, and in some exemplary embodiments of the present invention, the inorganic insulating material may be formed in a plurality of layers. The inorganic insulating material used may be 500 Å to 5000 Å thick.

ACT, which is over Buffer, refers to a polycrystalline semiconductor layer, in other words, the semiconductor layer 130 for the driving transistor T1. The polycrystalline semiconductor may be formed through a crystallization process of an amorphous semiconductor. The polycrystalline semiconductor layer may be formed to be 300 Å to 600 Å thick.

GI, which is over ACT, refers to the first gate insulating film 141, and the first gate insulating film 141 is formed of an inorganic insulating material such as a silicon oxide or a silicon nitride. The first gate insulating film 141 may have a thickness of 1000 Å to 2000 Å.

GAT1, which is over GI, refers to the first gate conductive layer, and includes the gate electrode 121 for the driving transistor in FIG. 3. The first gate conductive layer may be formed of various metals such as molybdenum (Mo), titanium (Ti), copper (Cu), and aluminum (Al), and may be formed as a plurality of layers including various metals. The first gate conductive layer may have a thickness of 2000 Å to 3000 Å.

ILD1, which is over GAT1, refers to the first interlayer insulating film 161, and may be formed of an inorganic insulating material such as a silicon oxide or a silicon nitride. The first interlayer insulating film 161 may have a thickness of 1000 Å to 1500 Å.

GAT2, which is over ILD1, refers to the second gate conductive layer, and includes the overlapping layer 126 for the second transistor T2 and the second electrode 122 for the storage capacitor Cst FIG. 3. The second gate conductive layer may be formed of various metals such as molybdenum (Mo), titanium (Ti), copper (Cu), and aluminum (Al), and may be formed as a plurality of layers including various metals. The second gate conductive layer may have a thickness of 2000 Å to 3000 Å.

ILD2, which is over GAT2, refers to the second interlayer insulating film 162, and may be formed of an inorganic insulating material such as a silicon oxide or a silicon nitride. The second interlayer insulating film 162 may have a thickness of 2500 Å to 4000 Å.

Oxide, which is over ILD2, refers to the oxide semiconductor layer, and includes the semiconductor layer 135 for the second transistor T2 in FIG. 3. The oxide semiconductor may include various materials, and may be formed of an IGZO. The oxide semiconductor layer may have a thickness of 200 Å to 500 Å.

GI2, which is over Oxide, refers to the second gate insulating film 142, and may be formed of an inorganic insulating material such as a silicon oxide or a silicon nitride. The second gate insulating film 142 may have a thickness of 1000 Å to 2000 Å.

GAT3, which is over GI2, refers to the third gate conductor, and includes the gate electrode 125 for the second transistor T2 and the connecting portions 176 and 178. The third gate conductive layer may be formed of various metals such as molybdenum (Mo), titanium (Ti), copper (Cu), and aluminum (Al), and may be formed as a plurality of layers including various metals. The third gate conductive layer may have a thickness of 2000 Å to 4000 Å.

ILD3, which is over GAT3, refers to the third interlayer insulating film 163, and may be formed of an inorganic insulating material such as a silicon oxide or a silicon nitride, and may be formed as a plurality of layers using the same. The third interlayer insulating film 163 may have a thickness of 2000 Å to 6000 Å. In some exemplary embodiments of the present invention, the third interlayer insulating film 163 may be formed as a double film of a silicon nitride film and a silicon oxide film. In addition, after the third interlayer insulating film 163 is stacked, a CMP process may be additionally performed to eliminate a step. Through the CMP process, the upper surface of the third interlayer insulating film 163 is planarized, and thus, the step due to the electrode and the semiconductor layer positioned below the third interlayer insulating film 163 is eliminated.

DAT1, which is over ILD3, refers to the first data conductive layer, and includes the second electrode 179 for the input capacitor Cpr in FIG. 3. The first data conductive layer may be formed of various metals such as molybdenum (Mo), titanium (Ti), copper (Cu), and aluminum (Al), and may be formed as a plurality of layers inducting various metals. The first data conductive layer may have a thickness of 3000 Å to 8000 Å.

ILD4, which is over DAT1, refers to the fourth interlayer insulating film 164, and may be formed of an inorganic insulating material such as a silicon oxide or a silicon nitride, and may be formed as a plurality of layers using the same. The fourth interlayer insulating film 164 may have a thickness of 1000 Å to 2000 Å.

DAT2, which is over ILD4, refers to the second data conductive layer, and includes the first electrode 175 and the second electrode 177 of the driving transistor T1, and the second electrode 171 and the first electrode 173 of the second transistor T2. The second data conductive layer may be formed of various metals such as molybdenum (Mo), titanium (Ti), copper (Cu), and aluminum (Al), and may be formed as a plurality of layers including various metals. The second data conductive layer may have a thickness of 6000 Å to 8000 Å.

VIA, which is over DAT2, refers to the passivation film 180, and the passivation film 180 may be formed to include an organic material, and may be formed of various organic materials such as polyimide (PI). The passivation film 180 may have a thickness of 9000 Å to 11,000 Å.

PXL, which is over VIA, refers to the pixel electrode layer, and includes the anode electrode 191 in FIG. 3. The pixel electrode layer may include a transparent conductive material such as an ITO, and may be formed to have a multi layered structure including silver (Ag) and various metals (e.g., aluminum (Al), molybdenum (Mo), titanium (Ti), copper (Cu), etc.). The pixel electrode layer may have a thickness of 1000 Å to 2000 Å.

PDL, which is over PXL, refers to the partition wall 300, and SPC, which is over PDL, may be formed separately or together with the partition wall 300 as a spacer. The partition wall 300 and the spacer may be formed of various organic materials such as polyimide (PI). The partition wall 300 may have a thickness of 8000 Å to 10,000 Å, and the spacer may have a thickness of 10,000 Å to 20,000 Å.

As described above, the first, second and third gate conductive layers may include the same material, and the first and second data conductive layers may also include the same material. In some exemplary embodiments of the present invention, the material included in the gate conductive layer and the material included in the data conductive layer may be different from each other.

As shown in FIG. 4, since the structure of the pixel according to the present embodiment is formed while overlapping in the vertical direction, the area occupied by the pixel is reduced, and thus, the number of pixels per inch (ppi) at which the pixels are formed is increased. Therefore, the resolution of the organic light emitting diode display device is increased.

As described above, the area occupied by the pixel formed based on the vertical structure is reduced. Accordingly, the ppi increases, which will be described with reference to FIG. 5 and FIG. 6.

Figure 5:
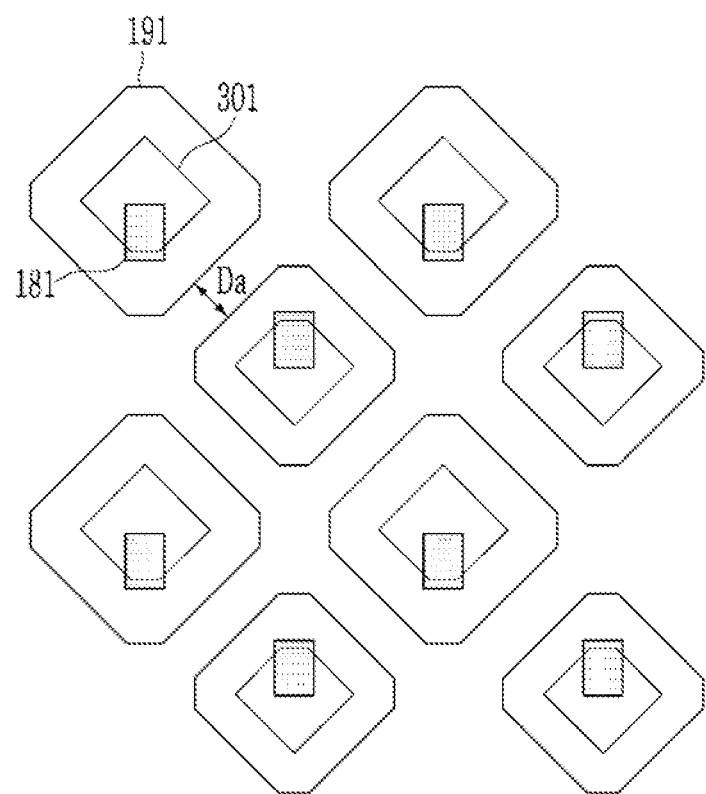
FIG. 5 illustrates a top plan view of an organic light emitting diode display device according to an exemplary embodiment of the present invention.
Figure 6:
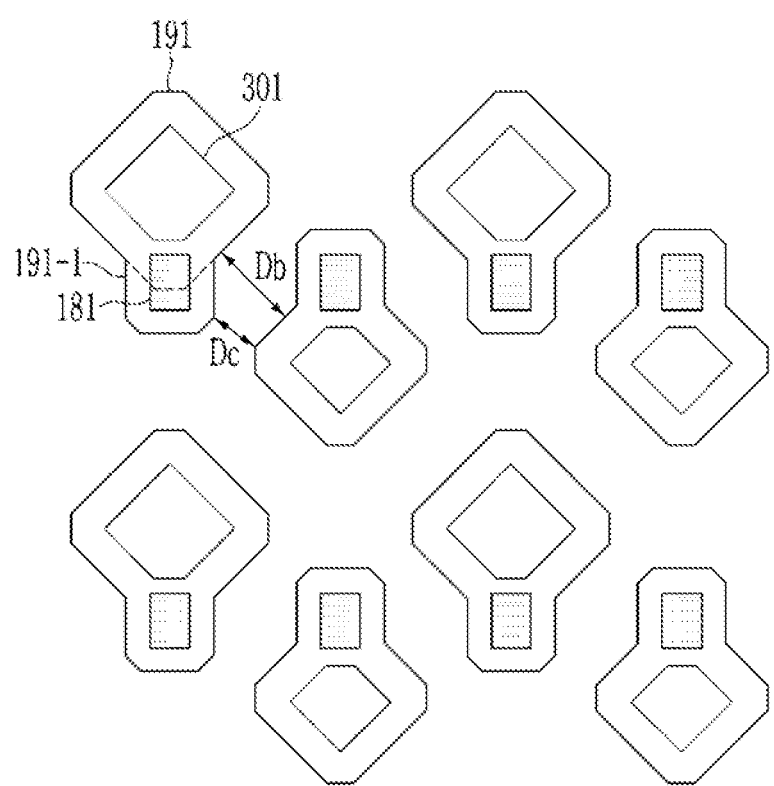
FIG. 6 illustrates a plan view of an organic light emitting diode display device according to a comparative example.

FIG. 5 illustrates a top plan view of an organic light emitting diode display device according to an exemplary embodiment of the present invention, and FIG. 6 illustrates a top plan view of an organic light emitting diode display device according to a comparative example.

FIG. 6, which corresponds to a comparative example, illustrates a structure in which the opening 301 of the partition wall 300 and the opening 181 of the passivation film 180 do not vertically overlap. Accordingly, it can be seen that the anode electrode 191 is formed wide because the anode electrode 191 has an extended portion 191-1 and connects the two openings 181 and 301.

In contrast, in FIG. 5, the opening 301 of the partition wall 300 and the opening 181 of the passivation film 180 vertically overlap each other, and thus the anode electrode 191 does not need to further include the additionally extended portion 191-1 as shown in FIG. 6. In other words, the anode electrode 191 of FIG. 5 does not have a protruded portion like the anode electrode 191 of FIG. 6. Accordingly, the area occupied by the anode electrode 191 of FIG. 5 is reduced.

Since a short circuit should not occur between the anode electrodes 191 of adjacent pixels, adjacent pixels are formed with a predetermined interval therebetween. In other words, in FIG. 5, the anode electrodes 191 are formed at an interval of Da.

In contrast, in FIG. 6, which illustrates the comparative example, since an interval Dc is formed so that a short circuit does not occur due to the extended portion 191-1 of the anode electrode 191, a distance between the anode electrodes 191 is formed as a Db interval, which is larger than the Da interval in FIG. 5. Accordingly, in FIG. 5, the number of pixels per inch (ppi) is further increased as compared with FIG. 6.

Modified embodiments related to the above-described embodiment are herein described with reference to FIG. 7 to FIG. 11.

FIG. 7 to FIG. 11 illustrate a cross-sectional view of a pixel of an organic light emitting diode display device according to an exemplary embodiment of the present invention, respectively.

Figure 7:
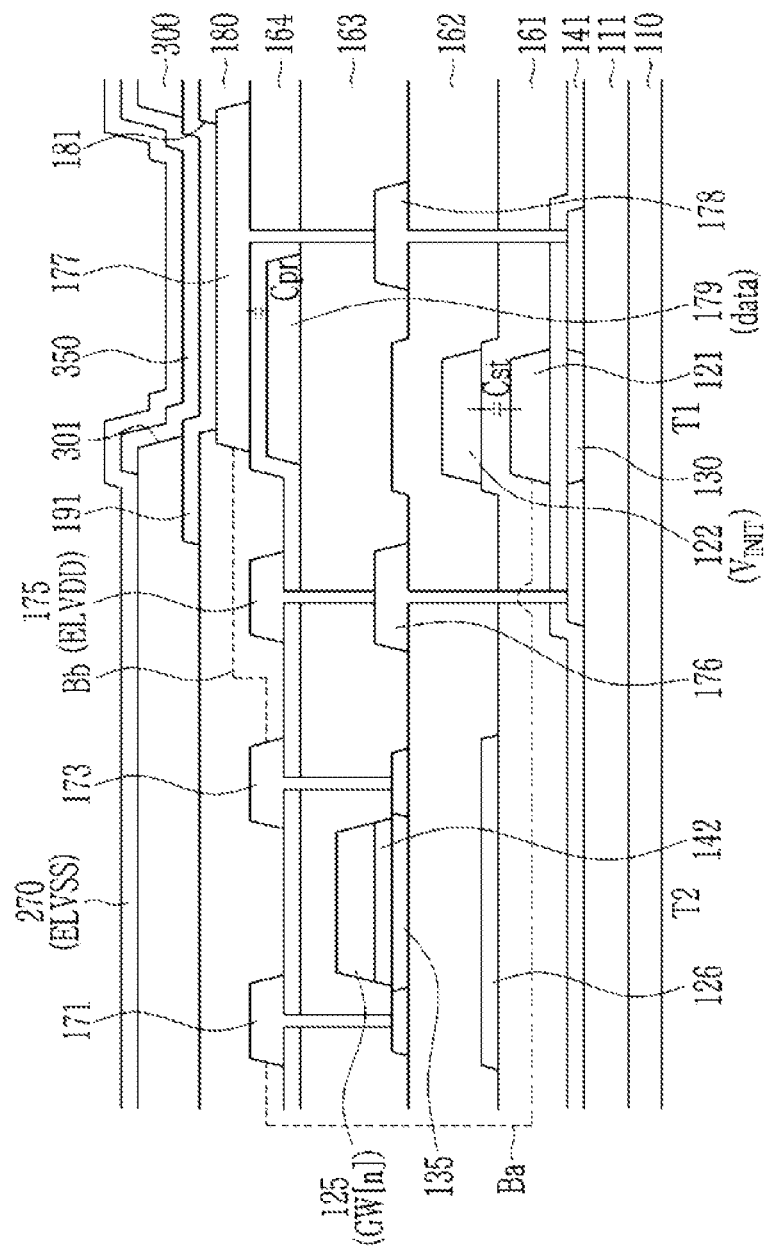
FIG. 7, FIG. 8, FIG. 9, FIG. 10 and FIG. 11 illustrate a cross-sectional view of a pixel of an organic light emitting diode display device according to an exemplary embodiment of the present invention, respectively.

First, unlike FIG. 3, FIG. 7 illustrates an example in which the opening 181 formed in the passivation film 180 is completely formed inside the opening 301 formed in the partition wall 300. In other words, referring to FIG. 3 and FIG. 5, at least a portion of the opening 181 formed in the passivation film 180 may be located outside the opening 301 formed in the partition wall 300 while referring to FIG. 7, all the opening 181 formed in the passivation film 180 is formed inside the opening 301 formed in the partition wall 300.

According to the embodiment of FIG. 7, the opening from the second region of the semiconductor layer 130 of the driving transistor T1 to the second electrode 177 are also completely formed inside the opening 301 formed in the partition wall 300. The opening from the second region of the semiconductor layer 130 of the driving transistor T1 to the second electrode 177 corresponds to the opening connecting the second region of the semiconductor layer 130 and the second connecting portion 178 and the opening connecting the second connecting portion 178 and the second electrode 177 in FIG. 3. In addition, besides the opening 181 formed in the passivation film 180, the second connecting portion 178 connecting the second region of the semiconductor layer 130 of the driving transistor T1 and the second electrode 177 may also be completely disposed in the anode electrode 191.

Accordingly, compared with that of FIG. 3, the embodiment of FIG. 7 may further reduce the area of the anode electrode 191 to form a more compact structure.

For reference, in FIG. 7, a width of the anode electrode 191 is drawn wider than that of the anode electrode 191 of FIG. 3 in order to show the vertical overlapping structure more clearly, but this may not mean that a size of the anode electrode 191 is larger than that of FIG. 3. For example, the anode electrode 191 of FIG. 7 is merely drawn larger to show a structure of a lower portion thereof.

The embodiment of FIG. 8 will be described below.

Figure 8:
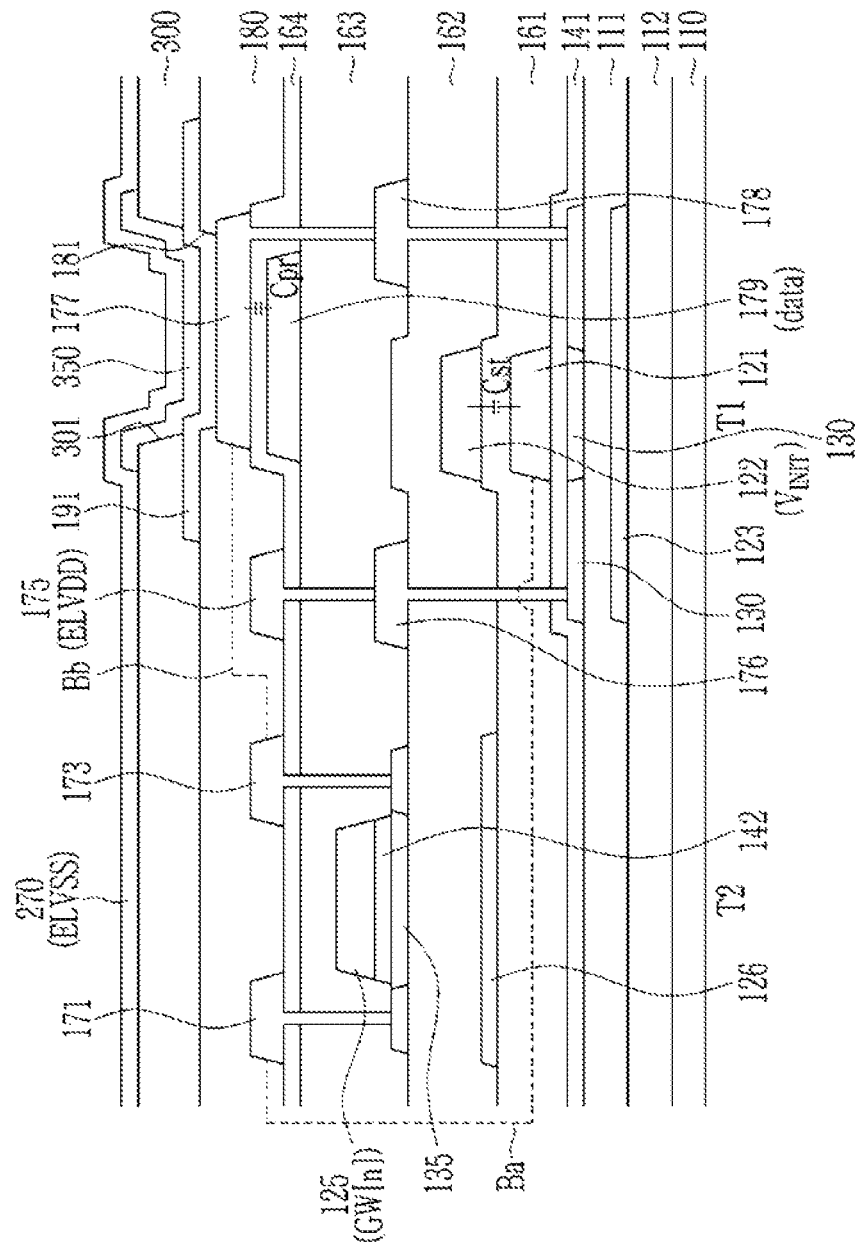

Unlike the embodiment of FIG. 3, FIG. 8 illustrates an embodiment in which an additional overlapping aver 123 is further included above the substrate 110 under the semiconductor layer 130 of the driving transistor T1.

Related portions will be described as follows.

In the embodiment of FIG. 8, a barrier layer 112 is positioned on the flexible substrate 110. The barrier layer 112 may be formed of an inorganic insulating material, or may have a multilayer structure formed of the inorganic insulating material.

The additional overlapping layer 123 is disposed on the barrier layer 112. The additional overlapping layer 123 may overlap the channel of the semiconductor layer 130 of the driving transistor T1, and may overlap at least a portion of the first and second regions of the driving transistor T1.

The buffer layer 111 is positioned on the additional overlapping layer 123, and a structure above the buffer layer 111 is the same as that of FIG. 3. Here, the overlapping layer 123 may receive a voltage of a constant level, may be electrically connected to an electrode of the driving transistor may receive the driving voltage ELVDD or the driving low voltage ELVSS, or may be floated. The additional overlapping layer 123 may secure channel characteristics of the driving transistor T1 to increase reliability of the driving transistor T1.

The embodiment of FIG. 9 will be described below.

Figure 9:
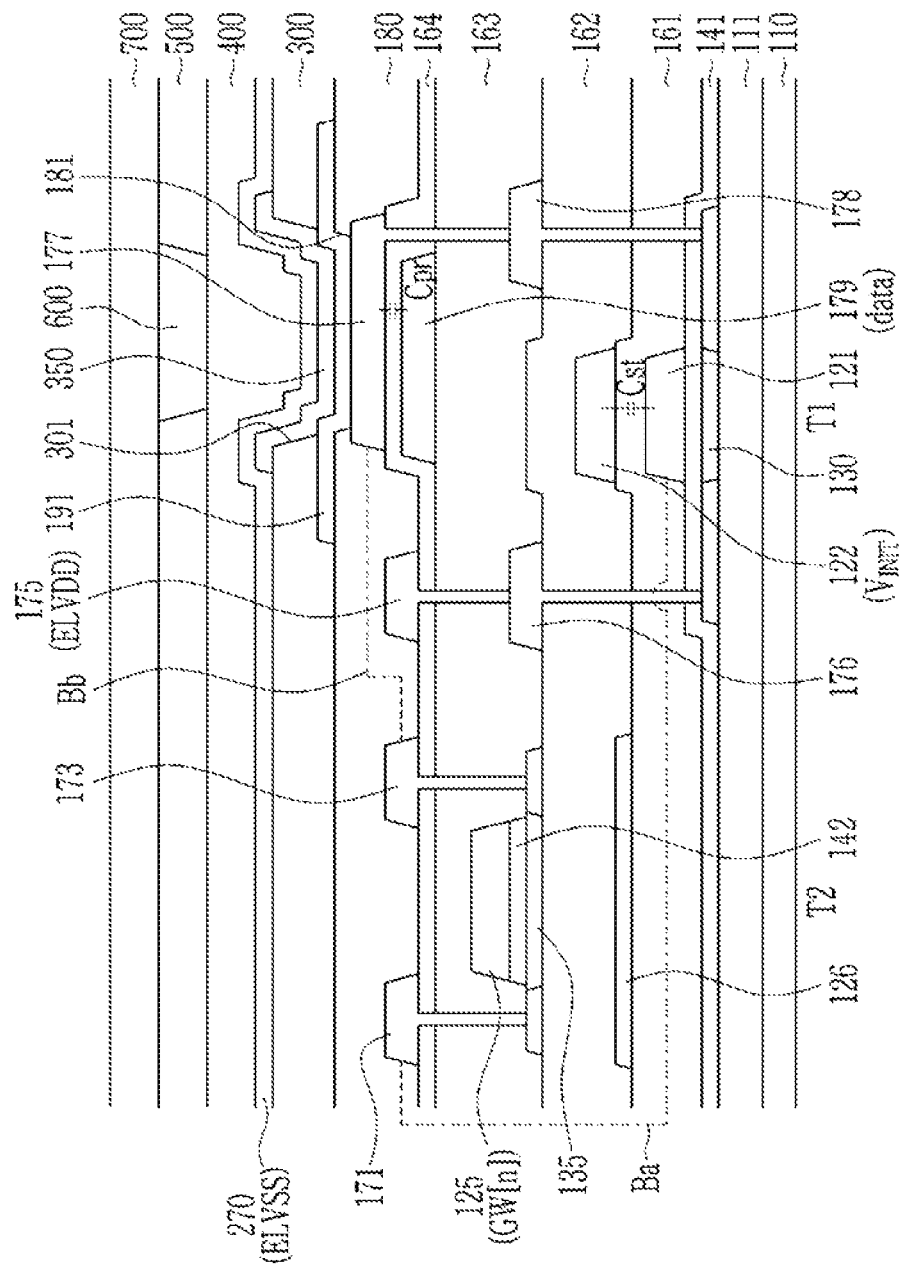

FIG. 9 illustrates an embodiment in which a layer positioned on the cathode electrode 270 is additionally formed in the structure of FIG. 3 and the organic light emitting diode OLED emits white light.

In the embodiment of FIG. 9, an encapsulation layer 400 is positioned on the cathode electrode 270. The encapsulation layer 400 may contact the cathode electrode 270, or may be spaced apart from the cathode electrode 270 by including a capping layer or a functional layer therebetween. In addition, the encapsulation layer 400 may be a thin film encapsulation layer in which an inorganic film and an organic film are stacked, and may include a triple layer formed of an inorganic film, an organic film, and an inorganic film. In FIG. 9, the encapsulation layer 400 is illustrated to be formed only at an upper side of a pixel, but this is because only a cross-section of the pixel is shown, and thus a side surface thereof is not shown. In other words, the encapsulation layer 400 may be formed on the side surface of the pixel in addition to the upper side so that oxygen or moisture is not absorbed into the organic light emitting layer 350 from the outside.

A light blocking member 500 and a color filter layer 600 are formed on the encapsulation layer 400. The color filter layer 600 is formed at a position corresponding to the opening 301 of the partition wall 300, so that the light emitted from the organic light emitting diode OLED may be provided to a user. On the other hand, the light blocking member 500 is formed in an area other than over the entire opening 301. When white light is emitted from the organic light emitting diode OLED, the color filter layer 600 transmits only one wavelength. of light of three primary colors to display a specific color. The color filter layer 600 includes at least three different kinds of color filter layers 600 to display colors, and one pixel displays only one color of the three primary colors, thus at least three pixels are mixed to display one display color.

In some exemplary embodiments of the present invention, the organic light emitting diode OLED may emit blue light. In this case, instead of using the color filter layer 600, by forming a color conversion layer including a color conversion material such as a quantum dot (QD), it is possible to display the three primary colors by converting blue light into red and green light based on the blue light.

A window 700 may be formed on the light blocking member 500 and the color filter layer 600. In some exemplary embodiments of the present invention, a touch sensing element may be formed on an inner surface of the window 700. In this case, since a wire (e.g., a touch wire) of the touch sensing element may be viewed by a user, a polarization layer may be additionally formed to prevent the touch wire from being viewed from the outside.

Figure 10:
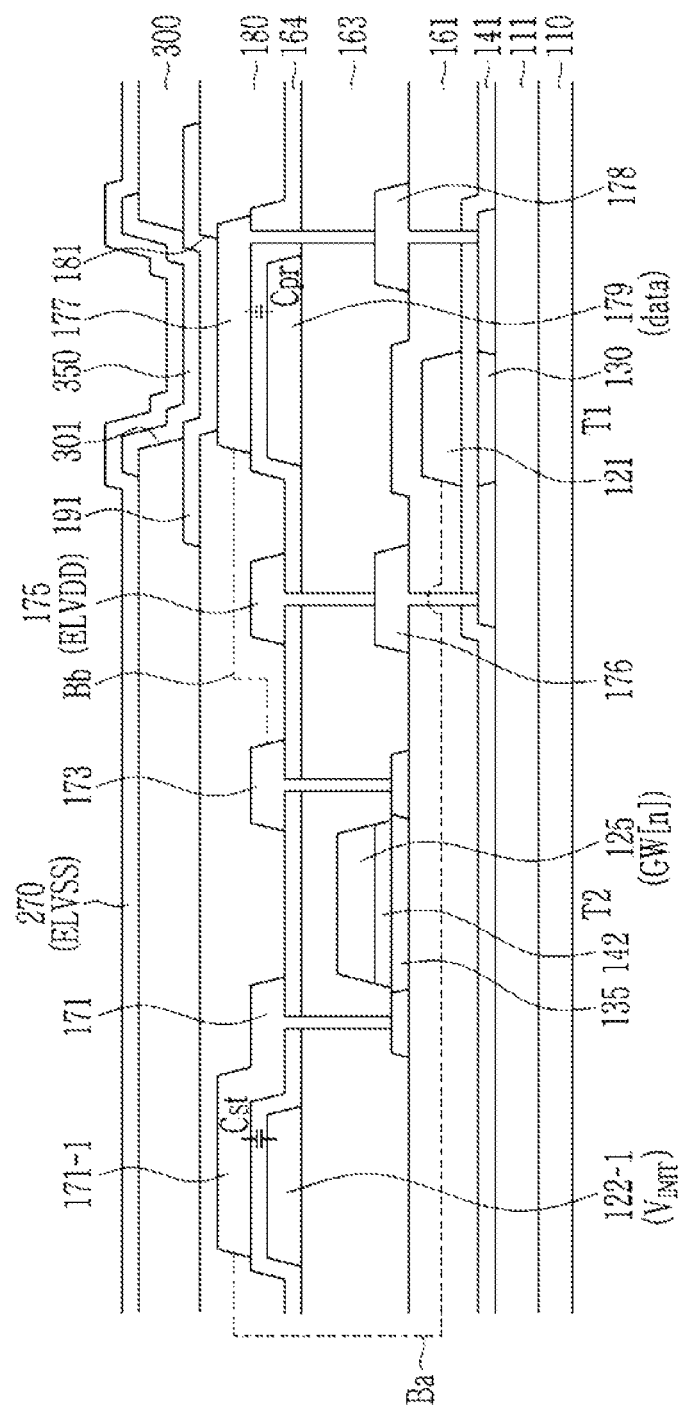

The embodiment of FIG. 10 will be described below.

in the embodiment of FIG. 10, unlike FIG. 3, the storage capacitor Cst and the input capacitor Cpr are not arranged to vertically overlap each other.

In other words, in the embodiment of FIG. 10, the second gate conductive layer is removed, and thus, the second electrode 122 for the storage capacitor Cst and the overlapping layer 126 for the second transistor T2 are removed. In addition, the second interlayer insulating film 162 is also removed.

In the embodiment of FIG. 10, unlike the embodiment of FIG. 3, a second electrode 122-1 for the storage capacitor Cst is formed in the first data conductive layer. The initialization voltage $V_{INIT}$ is applied to the second electrode 122-1 for the storage capacitor Cst. In some exemplary embodiments of the present invention, the second electrode 122-1 for the storage capacitor Cst may be integrally formed with a line (e.g., an initialization voltage line) for applying the initialization voltage $V_{INIT}$ thereto.

In this case, the second electrode 122-1 for the storage capacitor Cst is formed on the same layer (e.g., the first data conductive layer) as the second electrode 179 for the input capacitor Cpr.

The second electrode 122-1 for the storage capacitor Cst is covered with a fourth interlayer insulating film 164.

The second electrode 171 of the second transistor T2 positioned on the fourth interlayer insulating film 164 has an extension portion 171-1, and the extension portion 171-1 overlaps the second electrode 122-1 for the storage capacitor Cst. Accordingly, the storage capacitor. Cst is formed of the extension 171-1, the second electrode 122-1 for the storage capacitor Cst, and the fourth interlayer insulating film 164 positioned therebetween.

As a result, in the embodiment of FIG. 10, the number of masks used in manufacturing is reduced by reducing the number of layers used, but the area of the pixel is increased compared with FIG. 3.

In other words, when pixels are integrally formed, as shown in FIG. 10, the number of masks may be reduced to reduce manufacturing cost and processing time. The vertical structure between the openings 181 and 301 as shown in FIG. 5 is included in FIG. 10, and thus, the embodiment of FIG. 10 may have an improved ppi value compared to the comparative example of FIG. 6.

The embodiment of FIG. 11 will be described below.

Figure 11:
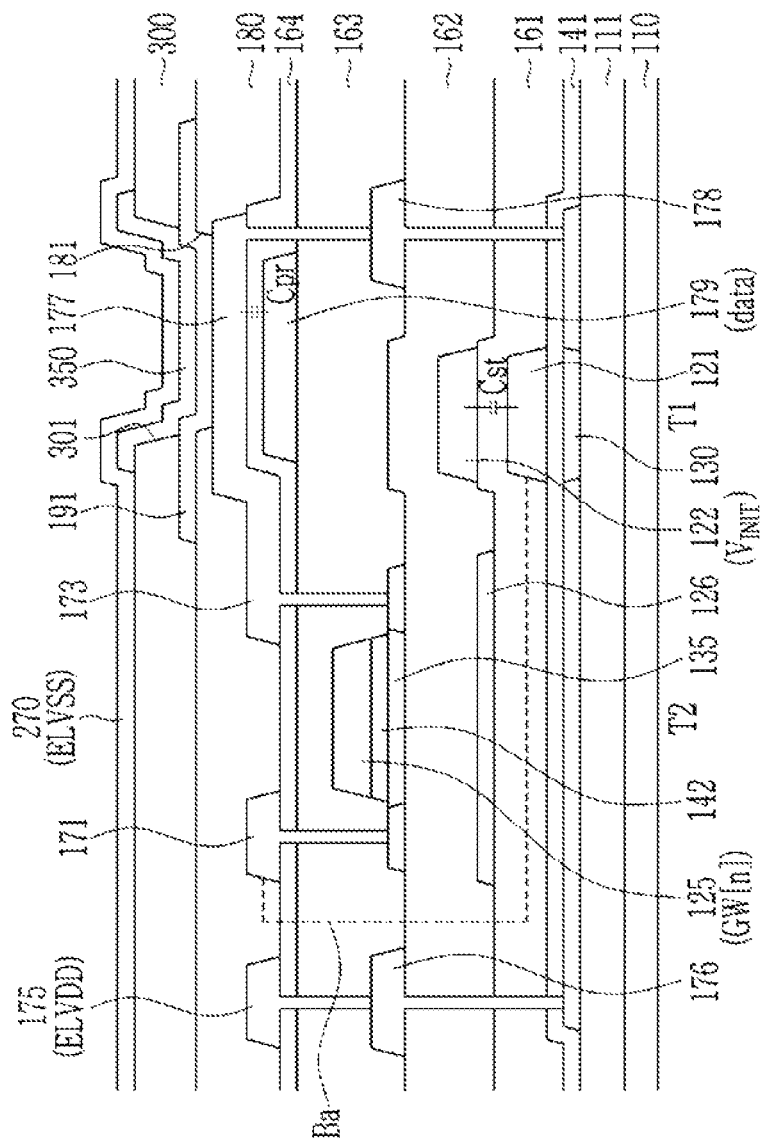

In FIG. 11, the second transistor T2 is positioned above the semiconductor layer 130 of the driving transistor T1 to minimize the area occupied by the pixel.

In other words, referring to FIG. 11, the second transistor T2 positioned at the left side in FIG. 3 is formed at a position overlapping the semiconductor layer 130 of the driving transistor T1.

In this case, in the embodiment of FIG. 11, the first electrode 173 of the second transistor T2 and the second electrode 17 of the driving transistor T1 are not electrically connected by the dotted line Bb but are directly integrally formed. In the embodiment of FIG. 11, at least a portion of the area occupied by the second transistor T2 overlaps the area of the driving transistor T1 such that the two transistors and T2 also have a vertical structure (also referred to as a vertical structure of a transistor). As a result, the area occupied by the pixel may be the smallest of the illustrated embodiments.

In the embodiments of FIG. 7 to FIG. 11 described above, the upper surface of the third interlayer insulating film 163 is flattened through the CMP process as shown in FIG. 3. As a result, in the embodiments of FIG. 7 to FIG. 11, the input capacitor Cpr positioned at the upper portion of the third interlayer insulating film 163 and the organic light emitting diode OLED may be formed without a step.

Hereinafter, an embodiment that is different from that of FIG. 1 and FIG. 2 will be described with reference to FIG. 12 and FIG. 13.

Figure 12:
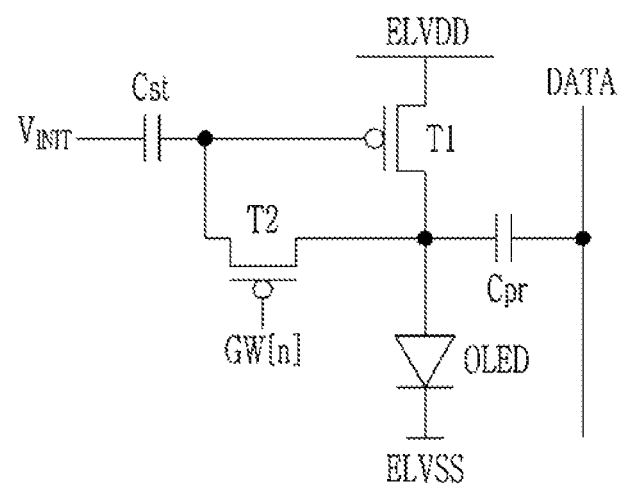
FIG. 12 illustrates an equivalent circuit diagram of a pixel of an organic light emitting diode display device according to another exemplary embodiment of the present invention.
Figure 13:
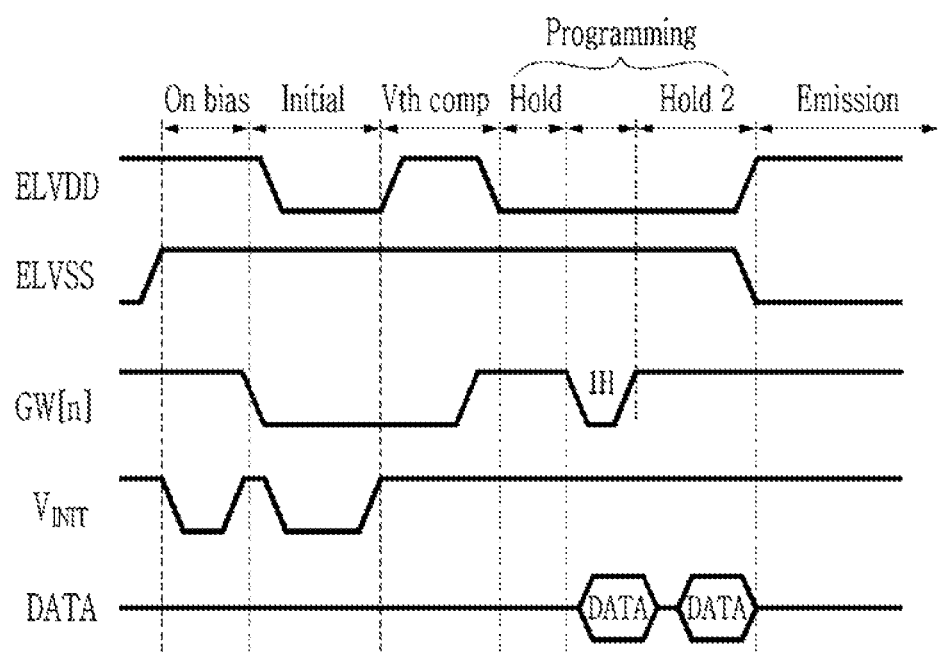
FIG. 13 illustrates a waveform diagram of a signal applied to the pixel of FIG. 12.

FIG. 12 illustrates an equivalent circuit diagram of a pixel of an organic light emitting diode display device according to another exemplary embodiment of the present invention, and FIG. 13 illustrates a waveform diagram of a signal applied to the pixel of FIG. 12.

Unlike FIG. 1 and FIG. 2, in FIG. 12 and FIG. 13, the second transistor T2 is a p-type transistor which is the same type as the driving transistor T1. The semiconductor layer 135 of the p-type transistor is doped with a different type of doping material from that of the n-type transistor, and thus the n-type transistor has a characteristic of being turned on by a low voltage. In the embodiment of FIG. 12 and FIG. 13, the gate-on voltage of the second transistor T2 has a low voltage level.

Comparing FIG. 2 and FIG. 13, it can be seen that the scan signal GW[n] of FIG. 13 has a voltage that is inverted from that of the scan signal GW[n] of FIG. 2. In other words, when the scan signal GW[n] of FIG. 2 has a high voltage, the scan signal GW[n] of FIG. 13 has a low voltage, and when the scan signal GW[n] of FIG. 2 has a low voltage, the scan signal GW[n] of FIG. 13 has a high voltage. All other timings are the same.

An operation of the embodiment of FIG. 12 and FIG. 13 is substantially the same as that of the embodiment of FIG. 1 and FIG. 2.

In some exemplary embodiments of the present invention, the type of the driving transistor T1 may also be changed to another type.

Exemplary embodiments of the present invention provide a light emitting diode display device that may reduce an area occupied by a pixel to increase the number of pixels per inch (ppi) and to increase resolution. For example, only two transistors may be used to drive one OLED. Furthermore the pixel may be made with a vertical structure to reduce area and increase resolution. In addition, exemplary embodiments of the present invention provide a light emitting diode display device in which some transistors included in a pixel have increased reliability while other transistors of the pixel may have a leakage current eliminated, thereby increasing a display quality. Accordingly, a display characteristic may be stabilized by using a transistor with an oxide semiconductor. While this invention has been particularly shown and described with reference to exemplary embodiments thereof, it is to be understood by those skilled in the art that various modifications may be made thereto without departing from the spirit and scope of the present invention as set forth in the appended claims.

What is claimed is:

1. A light emitting diode display device, comprising:
    a substrate;
    a first transistor disposed on the substrate and including a first electrode, a second electrode, and a gate electrode;
    a second transistor disposed on the substrate and including a first electrode, a second electrode, and a gate electrode;
    passivation film covering the first transistor and the second transistor and having a first opening overlapping a part of the first transistor;
    an anode electrode of an organic light emitting diode disposed on the passivation film; and
    a partition wall having a second opening overlapping a portion of the anode electrode, wherein:
    the gate electrode of the first transistor is connected to the second electrode of the second transistor,
    the second electrode of the first transistor is connected to the first electrode of the second transistor,
    the anode is connected to the second electrode of the first transistor through the first opening of the passivation film, and
    the first opening of the passivation film overlaps the second opening of the partition wall.

2. The light emitting diode display device of claim 1, further comprising:
    a first capacitor disposed on the substrate and including a first electrode connected to the gate electrode of the first transistor; and
    a second capacitor disposed on the substrate and including a first electrode connected to the second electrode of the first transistor.

3. The light emitting diode display device of claim 2, wherein the passivation film also covers the first capacitor and the second capacitor.

4. The light emitting diode display device of claim 2, wherein;
    the first capacitor further includes a second electrode receiving an initialization voltage, and
    the second capacitor further includes a second electrode connecter to a data line.

5. The light emitting diode display device of claim 4, wherein the first electrode of the first capacitor and the second electrode of the first transistor overlap each other to form the first capacitor.

6. The light emitting diode display device of claim 4, wherein the first electrode of the second capacitor and the second electrode of the second transistor overlap each other to form the second capacitor.

7. The light emitting diode display device of claim 4, wherein the first capacitor and the second capacitor overlap.

8. The light emitting diode display device of claim 2, wherein the second electrode of the first transistor is connected to the anode electrode, the first electrode of the second capacitor, and the first electrode of the second transistor.

9. The light emitting diode display device of claim 1, wherein the first electrode of the first transistor receives a driving voltage.

10. The light emitting diode display device of claim 1, wherein the first transistor further includes a polycrystalline semiconductor layer, and the second transistor further include an oxide semiconductor.

11. The light emitting diode display device of claim 1, wherein the first transistor further includes a polycrystalline semiconductor layer, and the second transistor further include a polycrystalline semiconductor.

12. The light emitting diode display device of claim 1, wherein the first opening is disposed in the second opening.

* * * * *